United States Patent
Kim et al.

(10) Patent No.: US 11,296,643 B2
(45) Date of Patent: Apr. 5, 2022

(54) MOTOR DRIVING APPARATUS AND HOME APPLIANCE INCLUDING THE SAME

(71) Applicant: LG Electronics Inc., Seoul (KR)

(72) Inventors: Seongju Kim, Seoul (KR); Donggeun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/919,660

(22) Filed: Jul. 2, 2020

(65) Prior Publication Data

US 2021/0006192 A1  Jan. 7, 2021

(30) Foreign Application Priority Data

Jul. 2, 2019  (KR) .................. 10-2019-0079319

(51) Int. Cl.
| | |
|---|---|
| *H02P 27/12* | (2006.01) |
| *H02P 21/18* | (2016.01) |
| *H02P 21/22* | (2016.01) |
| *A47L 9/28* | (2006.01) |
| *H02P 21/13* | (2006.01) |
| *H03H 1/02* | (2006.01) |

(52) U.S. Cl.
CPC ............ *H02P 27/12* (2013.01); *A47L 9/2831* (2013.01); *A47L 9/2842* (2013.01); *A47L 9/2889* (2013.01); *H02P 21/13* (2013.01); *H02P 21/18* (2016.02); *H02P 21/22* (2016.02); *H03H 1/02* (2013.01); *H02P 2201/03* (2013.01)

(58) Field of Classification Search
CPC ................................ H02P 27/12; H02P 21/18
USPC ................. 318/400.02, 400.01, 700
See application file for complete search history.

(56) References Cited

U.S. PATENT DOCUMENTS

| | | | |
|---|---|---|---|
| 8,884,577 B2* | 11/2014 | Tsuji ................. | H02M 1/32 |
| | | | 318/801 |
| 9,948,219 B2* | 4/2018 | Saha ................. | B60L 58/20 |
| 2018/0358894 A1* | 12/2018 | Lee ................ | H02M 7/53875 |

FOREIGN PATENT DOCUMENTS

| | | |
|---|---|---|
| EP | 1753108 | 2/2007 |
| EP | 1753119 | 2/2007 |
| JP | H09135591 | 5/1997 |

(Continued)

OTHER PUBLICATIONS

Korean Office Action in Korean Appln. No. 10-2019-0079319, dated Feb. 9, 2021, 10 pages (with English translation).

(Continued)

*Primary Examiner* — David Luo
(74) *Attorney, Agent, or Firm* — Fish & Richardson P.C.

(57) ABSTRACT

A motor driving apparatus for a home appliance includes: a power supply part configured to supply DC power, a DC-Link capacitor connected to the power supply part, an inverter connected to the DC-Link capacitor and comprising a plurality of switching elements, the inverter being configured to convert, by operating the plurality of switching elements, the DC power into AC power and output the converted AC power to a motor, a DC-Link resistor element disposed between the DC-Link capacitor and the inverter, a signal generator connected to the DC-Link resistor element and configured to generate and output a plurality of signals based on an output current flowing through the DC-Link resistor element, and a controller configured to control the inverter based on the plurality of signals received from the signal generator.

19 Claims, 11 Drawing Sheets

(56) References Cited

FOREIGN PATENT DOCUMENTS

| JP | 2001275392 | 10/2001 |
|----|------------|---------|
| JP | 2013251971 | 12/2013 |
| JP | 2016063575 | 4/2016 |
| KR | 1020080075309 | 8/2008 |
| KR | 1020170041413 | 4/2017 |

OTHER PUBLICATIONS

Extended European Search Report in EP Appln. No. 201836483, dated Nov. 9, 2020, 7 pages.
Baratiere et al., "A Novel Starting Method for Sensorless Brushless DC Motors with Current Limitation," Institute of Electrical and Electronics Engineers, dated 2012, 7 pages.

* cited by examiner

MOTOR DRIVING APPARATUS AND HOME APPLIANCE INCLUDING THE SAME

CROSS-REFERENCE TO RELATED APPLICATION

This application claims the priority benefit of Korean Patent Application No. 10-2019-0079319, filed on Jul. 2, 2019, the disclosure of which is incorporated herein by reference.

BACKGROUND OF THE INVENTION

Field of the Disclosure

The present disclosure relates to a motor driving apparatus and a home appliance including the same and, more particularly, to a motor driving apparatus that may calculate a phase current flowing through a motor using a dc-link resistor element and control output power of an inverter, and a home appliance including the same.

Description of the Related Art

A motor driving apparatus is an apparatus configured to drive a motor including a rotor which performs a rotary motion and a stator around which a coil is wound. The motor driving apparatus may be classified into a sensor type motor driving apparatus using a sensor, such as a hall sensor, and a sensorless type motor driving apparatus having no sensor. The general sensor type motor driving apparatus can easily check the rotation speed of the motor or the position of the rotor of the motor through the hall sensor or the like. On the other hand, the sensorless type motor driving apparatus can detect a phase current flowing through the motor on the basis of a current flowing between an inverter and the motor, and detect the rotation speed of the motor or the position of the rotor of the motor through calculation based on the phase current.

A general sensor type motor driving apparatus according to related art 1 (Korean Patent Laid-Open Publication No. 10-2014-0082747) may easily check the rotation speed of a motor or the position of a rotor of the motor through a hall effect sensor.

In contrast, since a sensorless type motor driving apparatus according to related art 2 (Korean Patent Publication No. 10-1635551) may not check the rotation speed of the motor or the position of the rotor through the hall effect sensor, this apparatus detects the phase current of each phase flowing through the motor on the basis of a current flowing between an inverter and the motor, and detects the rotation speed of the motor or the position of the rotor of the motor through calculation based on the phase current, thus controlling the operation of the motor.

Since the sensorless type motor driving apparatus controls the operation of the motor through various calculations based on the current flowing between the inverter and the motor, it is larger in calculation amount of a controller and it is relatively more difficult to control the operation of the motor, as compared with the sensor type motor driving apparatus.

Particularly, when the case of detecting a current flowing through one shunt resistor and calculating the phase current of each phase flowing through the motor through calculation on the basis of the detected current, thus controlling the operation of the motor, as in related art 3 (Korean Patent Laid-Open Publication No. 10-2011-0030304), is compared with the case of detecting the phase current of each phase flowing through the motor via two or three shunt resistors, related art 3 is problematic in that it is larger in calculation amount of the controller and it is more complicated to control the operation of the motor.

Nevertheless, for the reason of a reduction in manufacturing cost, the sensorless type motor driving apparatus is widely used in recent years, and various studies are being conducted to efficiently operate the motor in the sensorless type motor driving apparatus.

SUMMARY

The present disclosure provides a motor driving apparatus that hardware-wise processes a current flowing through one shunt resistor through various circuit components, thus being capable of generating a plurality of signals, and a home appliance including the motor driving apparatus.

The present disclosure also provides a motor driving apparatus that uses a plurality of signals generated on the basis of a current flowing through one shunt resistor to control the operation of a motor, thus being capable of reducing the calculation amount of a controller related to the process of the current flowing through the shunt resistor, and a home appliance including the motor driving apparatus.

In an aspect, a motor driving apparatus is provided. The motor driving apparatus includes a dc-link resistor element disposed between a dc-link capacitor and an inverter, and a signal generator configured to generate a plurality of signals, on the basis of voltage on both ends of the dc-link resistor element. A controller may variously control the operation of the inverter, on the basis of the plurality of signals received from the signal generator.

The controller may control the inverter to calculate a phase current flowing through the motor, on the basis of a first signal received from the signal generator, and to detect an intensity of the current flowing through the dc-link resistor element, on the basis of a second signal received from the signal generator, and thereby to change output power of the inverter on the basis of an intensity of the output current.

The motor may be a three-phase motor, and the controller may calculate a three-phase current flowing through the motor, on the basis of the first signal, and may calculate a rotation speed of the motor, on the basis of the three-phase current.

The motor driving apparatus may include a signal amplification part configured to amplify and output voltage on both ends of the dc-link resistor element, a first filter having a first bandwidth, eliminating noise included in output of the signal amplification part, and then outputting the first signal, and a second filter having a second bandwidth, eliminating noise included in output of the signal amplification part, and then outputting the second signal.

The first bandwidth of the first filter may be wider than the second bandwidth of the second filter.

The signal amplification part may include an amplifier that amplifies and outputs voltage on both ends of the dc-link resistor element, the first filter may include a first resistor element connected between an output terminal of the amplifier and the controller, and a first capacitor element connected between a node to which the first resistor element and the controller are connected and a ground terminal, and the second filter may include a second resistor element connected between the output terminal of the amplifier and the controller, and a second capacitor element connected between a node to which the second resistor element and the controller are connected and the ground terminal.

The signal amplification part may include a plurality of amplifiers that amplify and output voltage on both ends of the dc-link resistor element, the first filter may include a first resistor element connected between an output terminal of the first amplifier among the plurality of amplifiers and the controller, and a first capacitor element connected between a node to which the first resistor element and the controller are connected and a ground terminal, and the second filter may include a second resistor element connected between the output terminal of the second amplifier among the plurality of amplifiers and the controller, and a second capacitor element connected between a node to which the second resistor element and the controller are connected and the ground terminal.

The motor driving apparatus may control the inverter to reduce output power of the inverter, when an intensity of the current flowing through the dc-link resistor element is equal to or more than a first target.

The motor driving apparatus may control the inverter to maintain the output power of the inverter, when the intensity of the current flowing through the dc-link resistor element is less than the first target and is equal to or more than a second target.

The motor driving apparatus may control the inverter to increase the output power of the inverter, when the intensity of the current flowing through the dc-link resistor element is less than the second target and is equal to or more than a third target.

The motor driving apparatus may control the inverter to stop an operation of the motor, when the intensity of the current flowing through the dc-link resistor element is less than the third target.

The motor driving apparatus may determine whether an over-current is conducted to the inverter, on the basis of a third signal received from the signal generator.

The signal generator may further include a third filter including a third resistor element connected between a node to which the dc-link resistor element and the inverter are connected and the controller, and a third capacitor element connected between a node to which the third resistor element and the controller are connected and the ground terminal.

In another aspect, a home appliance is provided. The home appliance may include a motor driving apparatus including a dc-link resistor element disposed between a dc-link capacitor and an inverter, and a signal generator configured to generate a plurality of signals, on the basis of voltage on both ends of the dc-link resistor element. A controller may control the inverter, on the basis of the plurality of signals received from the signal generator.

DETAILED DESCRIPTION

Figure 1A:
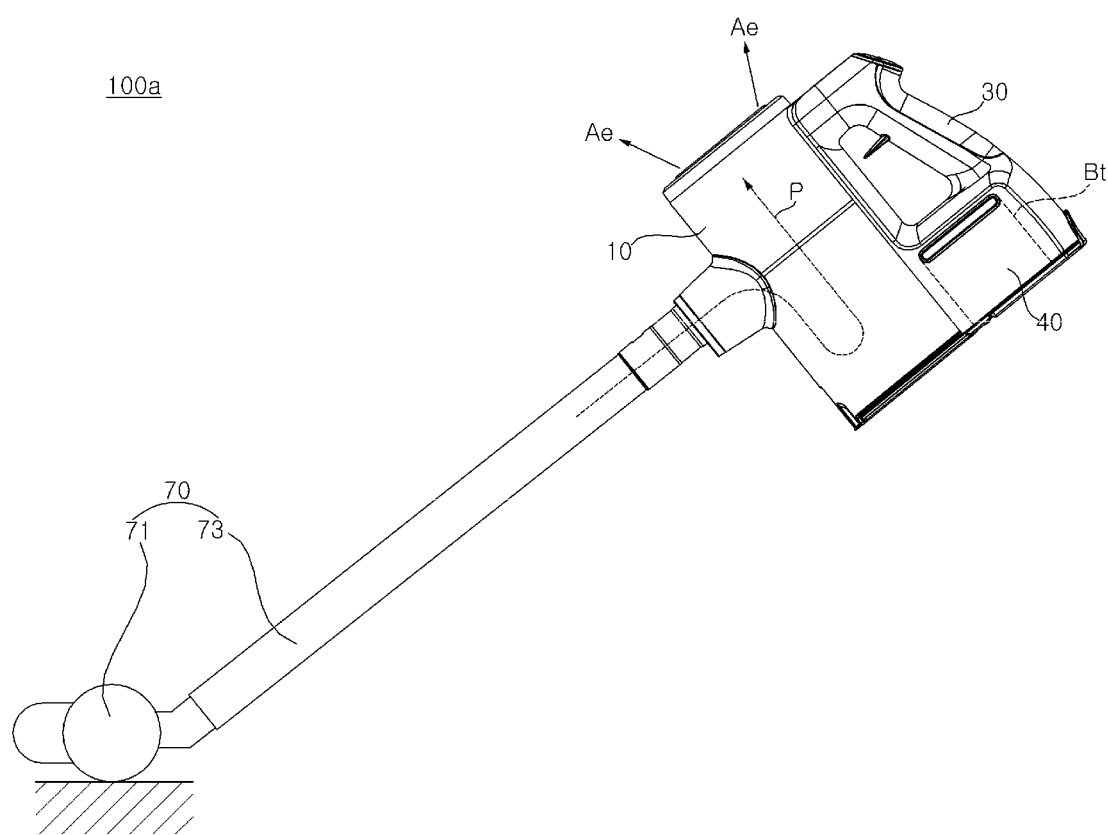
FIG. 1A is a side elevation view of a cleaner that is an example of a home appliance in accordance with an embodiment of the present disclosure.

Hereinafter, the present disclosure will be described in detail with reference to the accompanying drawings. In order to clearly and briefly describe the present disclosure, components that are irrelevant to the description will be omitted in the drawings. The same reference numerals are used throughout the drawings to designate the same or similar components.

Terms "module" and "part" for elements used in the following description are given simply in view of the ease of the description, and do not carry any important meaning or role. Therefore, the "module" and the "part" may be used interchangeably.

It should be understood that the terms "comprise", "include", "have", etc. when used in this specification, specify the presence of stated features, integers, steps, operations, elements, components, or combinations of them but do not preclude the presence or addition of one or more other features, integers, steps, operations, elements, components, or combinations thereof.

It will be understood that, although the terms "first", "second", etc. may be used herein to describe various elements, these elements should not be limited by these terms. These terms are only used to distinguish one element from another element.

Unless otherwise defined, all terms including technical and scientific terms used herein have the same meaning as commonly understood by one of ordinary skill in the art to which the present disclosure belongs. Further, terms defined in a common dictionary will not be interpreted in an idealized or overly formal sense unless expressly so defined herein.

In the drawings, the thicknesses or the sizes of elements and graphs may be exaggerated, omitted or simplified to more clearly and conveniently illustrate the present disclosure.

Figure 1B:
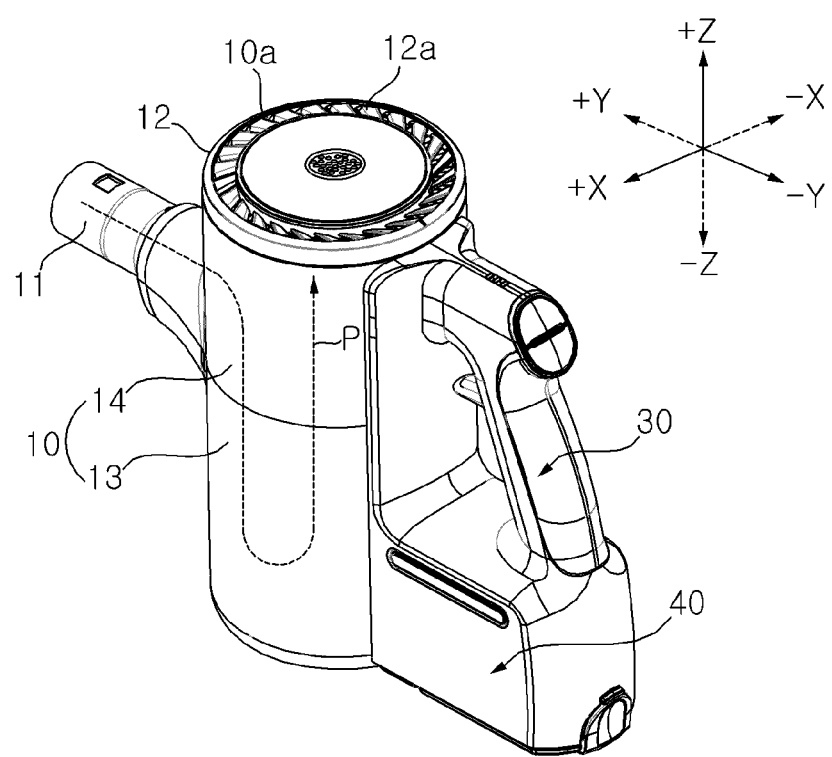
FIG. 1B is a perspective view of the cleaner with a nozzle module being detached from FIG. 1A.
Figure 1C:
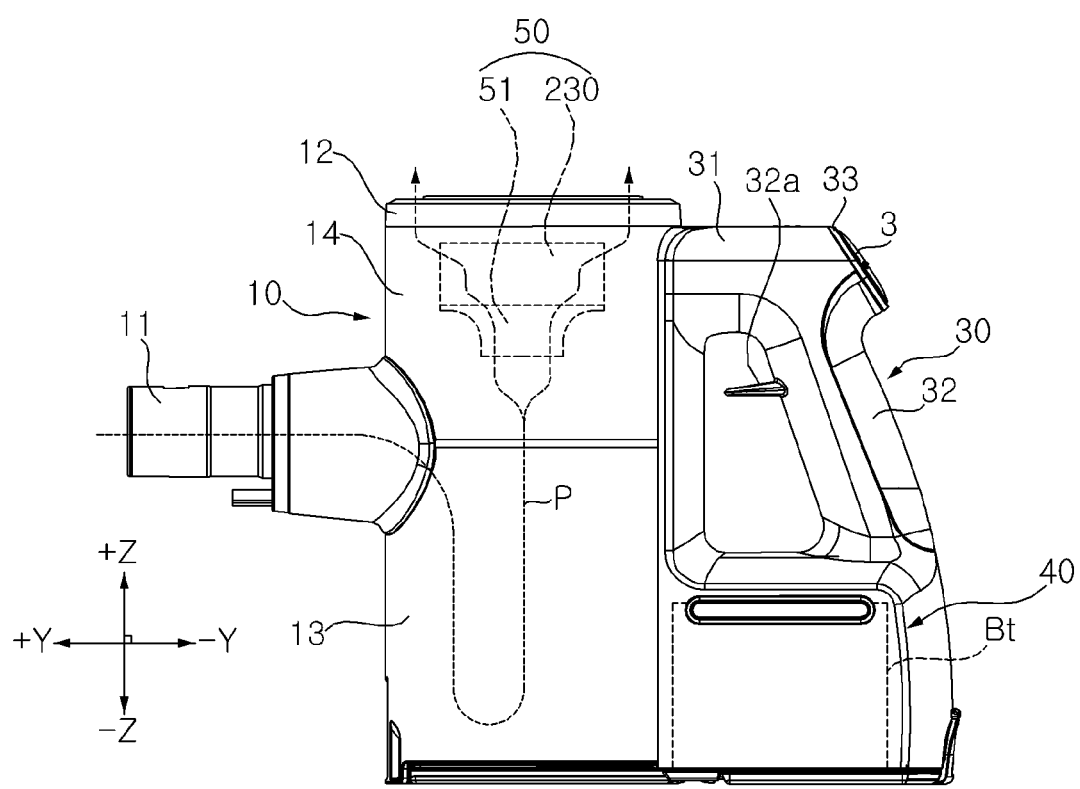
FIG. 1C is a side view of the cleaner of FIG. 1B.

FIG. 1A is a side elevation view of a cleaner that is an example of a home appliance in accordance with an embodiment of the present disclosure, FIG. 1B is a perspective view of the cleaner with a nozzle module being detached from FIG. 1A, and FIG. 1C is a side view of the cleaner of FIG. 1B.

Referring to FIGS. 1A to 1C, a cleaner 100a that is an example of a home appliance in accordance with an embodiment of the present disclosure may include, for example, a main body 10 that defines a path P to guide sucked air and thereby discharge the sucked air to an outside, a handle 30 coupled to a rear side of the main body 10, a nozzle module 70 detachably connected to a suction part 11 of the main body 10, a battery Bt supplying power, a battery housing 40 accommodating the battery Bt therein, and/or a fan module 50 disposed on the path P to move air in the path.

The nozzle module 70 may include, for example, a nozzle part 71 provided to suck external air, and an extension pipe 73 extending long from the nozzle part 71.

The extension pipe 73 may connect the nozzle part 71 and the suction part 11, for example. The extension pipe 73 may guide, for example, air sucked from the nozzle part 71 to introduce the air into the suction path P. One end of the extension pipe 73 may be detachably coupled to the suction part 11 of the main body 10, for example. A user may clean while holding the handle 30 and moving the nozzle part 71 in a state where the nozzle part 71 is placed on a floor.

The main body 10 may include, for example, a discharge cover 12 that forms an exhaust port 10a, a dust collector 13 that stores separated dust, and/or a fan module housing 14 that accommodates the fan module 50 therein.

The discharge cover 12 may form, for example, an upper surface of the main body 10 to cover the top of the fan module housing 14.

The dust collector 13 may be formed in a cylindrical shape, for example. The dust collector 13 may be disposed under the fan module housing 14, for example. Thus, a dust storage space may be formed in the dust collector 13.

For example, the fan module housing 14 may extend upwards from the dust collector 13. The fan module housing 14 may be formed in a cylindrical shape, for example. An extension part 31 of the handle 30 may be disposed on a rear side of the fan module housing 14.

The fan module 50 may be disposed in the fan module housing 14.

The fan module 50 may include, for example, a suction motor 230 that rotates an impeller 51. For example, the suction motor 230 may be positioned above a dust separator.

For example, the impeller 51 may be disposed under the suction motor 230. For example, the impeller 51 may be coupled to the suction motor 230 to be rotated by the rotating force of the suction motor 230.

Meanwhile, the impeller 51 may compress the air by rotation, thus allowing the air in the path P to be discharged through the exhaust port 10a, for example.

Meanwhile, the cleaner 100a may include a motor driver (not shown) to control the suction motor 230, for example. The motor driver may be disposed between the suction motor 230 and the dust collector 13, for example. Meanwhile, the motor driver may be provided with a circuit element disposed on a PCB circuit board, for example.

For example, the handle 30 may extend in a vertical direction and include an additional extension part 32. For example, the additional extension part 32 may be spaced apart from the main body 10 in a horizontal direction. A user may grasp the additional extension part 32 and use the cleaner 100a. For example, an upper end of the additional extension part 32 may be connected to a rear end of the extension part 31. For example, a lower end of the additional extension part 32 is connected to the battery housing 40.

For example, the additional extension part 32 may be provided with a movement limiter 32a so as to prevent the hand from being moved in a longitudinal direction (vertical direction) of the additional extension part 32 in a state where a user grasp the additional extension part 32. For example, the movement limiter 32a may protrude forwards from the additional extension part 32.

For example, the movement limiter 32a may be spaced apart from the extension part 31 in the vertical direction. In a state where a user grasps the additional extension part 32, some fingers of the user's hand may be positioned above the movement limiter 32a, and the remaining fingers may be positioned under the movement limiter 32a.

For example, the handle 30 may include an inclined surface 33 that faces upwards and rearwards. For example, the inclined surface 33 may be positioned on the rear surface of the extension part 31. For example, an input part 3 may be disposed on the inclined surface 33.

For example, the battery Bt may supply power to the fan module 50. For example, the battery Bt may supply power to a noise control module. For example, the battery Bt may be detachably disposed in the battery housing 40.

The battery housing 40 may be, for example, coupled to the rear side of the main body 10. The battery housing 40 may be, for example, disposed under the handle 30. The battery Bt may be, for example, accommodated in the battery housing 40. For example, a heat dissipation hole may be formed in the battery housing 40 to dissipate heat generated from the battery Bt to an outside.

Meanwhile, the exhaust port 10a may be, for example, disposed to face in a specific direction (e.g. upward direction). For example, a plurality of exhaust ports 10a may be divided into each other in a circumferential direction by a plurality of exhaust guides 12a. For example, the plurality of exhaust ports 10a may be spaced apart from each other by a predetermined distance in the circumferential direction.

Figure 2:
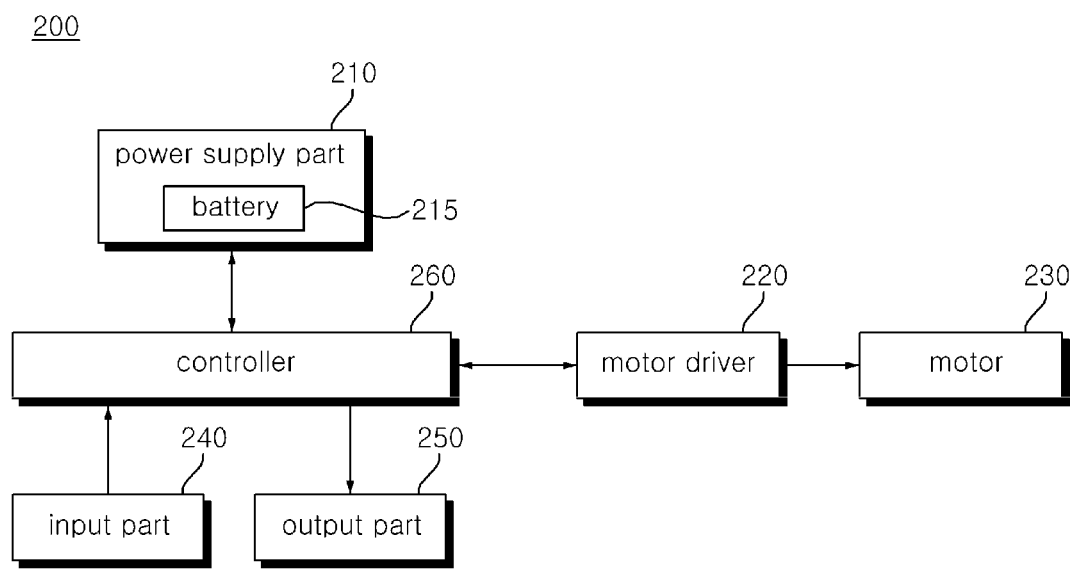
FIG. 2 is an example of an internal block diagram of a motor driving apparatus in accordance with an embodiment of the present disclosure.

FIG. 2 is an example of an internal block diagram of a motor driving apparatus in accordance with an embodiment of the present disclosure.

Referring to FIG. 2, the motor driving apparatus 200 may include, for example, a power supply part 210, a motor driver 220, a motor 230, an input part 240, an output part 250, and/or a controller 260.

For example, the power supply part 210 may supply power to the motor driving apparatus 200.

For example, the power supply part 210 may convert AC power input from commercial AC power into DC power to supply the DC power.

For example, the power supply part 210 may be provided with a converter (not shown), and may convert the AC power into the DC power through the converter.

The power supply part 210 may be provided with, for example, a battery 215 (e.g. battery Bt of FIG. 1A) storing the DC power. For example, the power supply part 210 may supply the DC power stored in the battery 215 as the power of the motor driving apparatus 200.

For example, the power supply part 210 may convert the AC power into the DC power to store the DC power in the battery 215.

The power supply part 210 may further include a dc-link capacitor (not shown), and store the DC power converted through the converter and/or the DC power supplied from the battery 215 in the dc-link capacitor.

The motor driver 220 may drive, for example, the motor 230. For example, the motor driver 220 may drive the motor 230 on the basis of power supplied from the power supply part 210.

For example, the motor driver 220 may be provided with a plurality of switching elements, include an inverter (not shown) that converts the DC power into a predetermined frequency of AC power and outputs the AC power through the on/off operation of the switching elements, and supply the AC power output from the inverter to the motor 230.

For example, the motor driver 220 may further include a current detector (not shown) that detects a current flowing through each component of the motor driving apparatus 200 and/or a voltage detector (not shown) that detects a voltage applied to each component.

In order to detect the current, the current detector may include, for example, a current sensor, a current transformer (CT), a shunt resistor and the like, and the detected current may be input into the controller 260.

For example, the motor driver 220 may include a current detector that detects a current flowing through the inverter.

In order to detect the voltage, the voltage detector may include, for example, a resistor element, an operational amplifier (op-amp) and the like, and the detected voltage may be input into the controller 260.

For example, the motor driver 220 may include the voltage detector that detects the voltage applied to the dc-link capacitor.

For example, the motor 230 may be driven according to the power supplied from the motor driver 220.

For example, the motor 230 may be driven according to a predetermined frequency of AC power supplied from the motor driver 220. For example, the operation of the motor 230 may be changed according to the level and/or frequency of the AC power supplied from the motor driver 220.

Examples of the motor 230 may include a Surface-Mounted Permanent-Magnet Synchronous Motor (SMPMSM), an Interior Permanent Magnet Synchronous Motor (IPMSM), a Reluctance Motor (SynRM), etc. Among them, each of the SMPMSM and the IPMSM is a Permanent Magnet Synchronous Motor (PMSM) to which a permanent magnet is applied, and the Synrm has no permanent magnet.

For example, the input part 240 (e.g. the input part 3 of FIG. 1C) may be provided with an input apparatus (e.g. key, touch panel, etc.) that may receive a user input. For example, the input part 240 may include a power key for turning on or off the power of the home appliance, an operation key for setting the operation mode of the motor driving apparatus 200, etc.

For example, the input part 240 may receive the user input through an input apparatus, and transmit a command corresponding to the received user input to the controller 260. For example, the controller 260 may determine the operation mode of the motor driving apparatus 200 on the basis of the user input that is input through the input part 240.

For example, the output part 250 may include a display device such as a display (not shown) or a Light Emitting Diode (LED). For example, the output part 250 may display the power on/off state of the motor driving apparatus 200, an operating condition depending on an operation mode, a message related to error occurrence, etc.

For example, the output part 250 may include an audio device such as a speaker or a buzzer. For example, the output part 250 may output an effect sound according to the power on/off state of the motor driving apparatus 200, an effect sound according to a change in operation mode, and a warning sound for error occurrence.

For example, the controller 260 may be connected to each component provided in the motor driving apparatus 200. For example, the controller 260 may transmit or receive a signal to or from each component of the motor driving apparatus 200, and control the overall operation of each component.

For example, the controller 260 may control the operation of the motor driver 220. For example, the controller 260 may output a switching signal for controlling the switching operation of the inverter included in the motor driver 220. Here, the switching signal may be, for example, a control signal of a pulse width modulation (PWM) having a predetermined duty cycle and frequency.

For example, the controller 260 may control the operation of the motor driver 220 to change the frequency of the AC power flowing through the motor 230. For example, the controller 260 may control to change the frequency of the AC power output from the motor driver 220, thus changing the rotation speed of the motor 230.

Meanwhile, the motor driving apparatus 200 according to various embodiments of the present disclosure may control the operation of the motor 230 by the sensorless type in which a component such as a hall sensor for sensing the rotor position of the motor 230 is not provided inside or outside the motor 230.

For example, the controller 260 may calculate the current flowing through the motor 230. For example, the controller 260 may calculate the current flowing through the motor 230, on the basis of the current flowing through the inverter.

For example, the controller 260 may calculate the phase current flowing through the motor 230. In this case, when the motor 230 is a three-phase motor, the controller may detect the three-phase current flowing through the motor 230.

For example, the controller 260 may calculate the rotation speed of the motor 230. For example, the controller 260 may calculate the rotation speed of the motor 230, on the basis of the phase current flowing through the motor 230.

For example, the controller 260 may determine whether it is necessary to change the output power of the inverter included in the motor driver 220. For example, the controller 260 may determine whether it is necessary to change the output power of the inverter, on the basis of the current flowing through the inverter.

For example, the controller 260 may change the output power of the inverter. For example, the controller 260 may change the intensity of output current flowing through the motor 230 by controlling the switching operation of the inverter, thus changing the output power of the inverter.

Here, when the intensity of the output current flowing through the motor 230 increases, the output power of the inverter may be increased and the torque of the motor 230 may be increased.

Figure 3A:
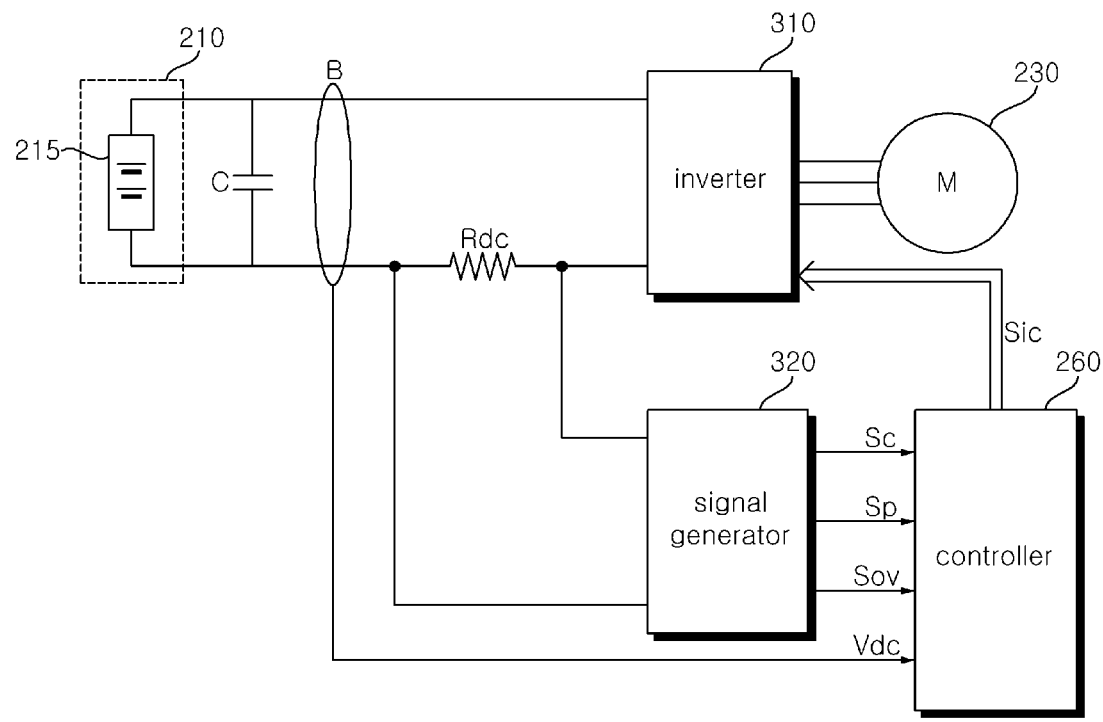
FIGS. 3A and 3B are an example of an internal circuit diagram of the motor driving apparatus in accordance with the embodiment of the present disclosure.
Figure 3B:
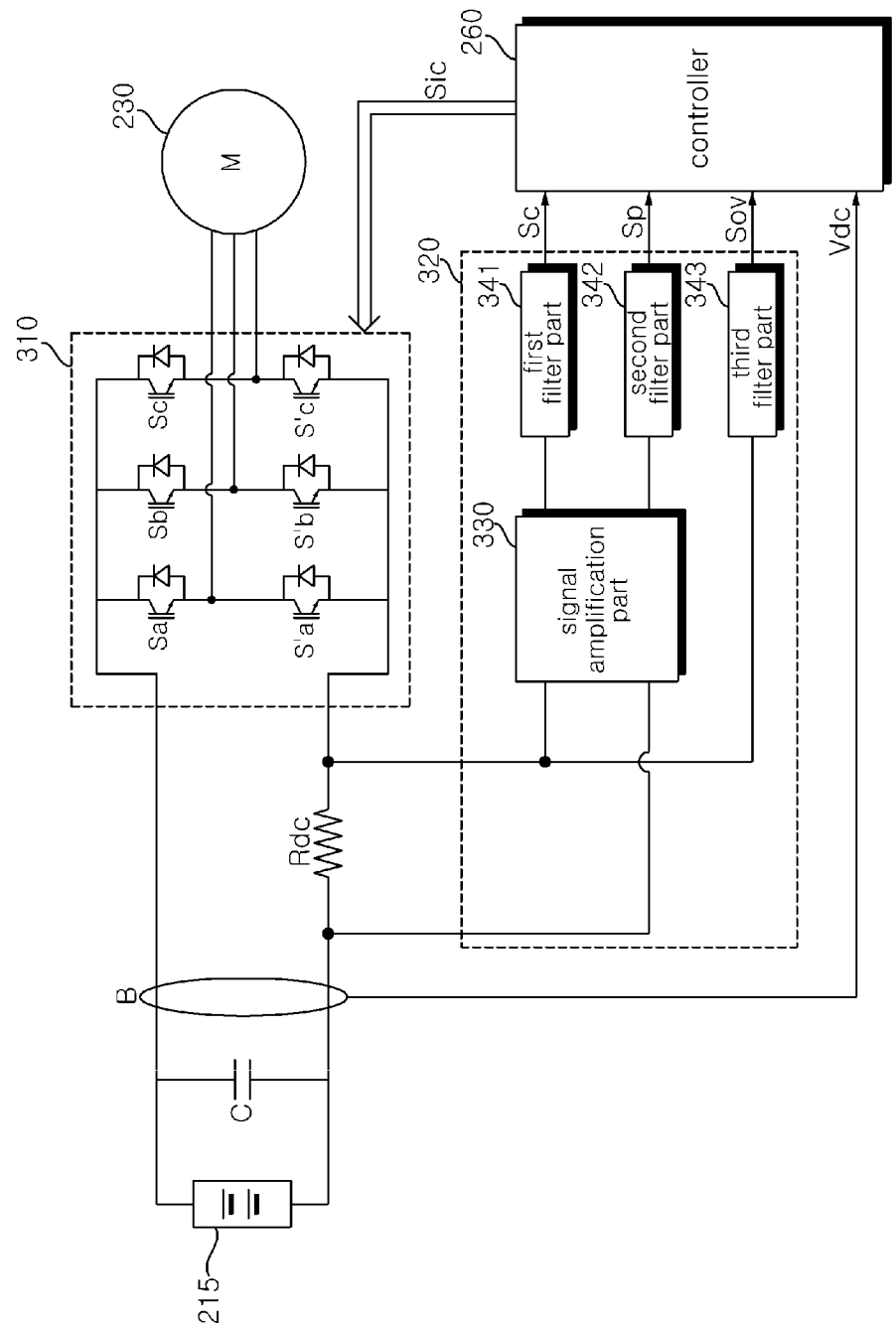

FIGS. 3A and 3B are an example of an internal circuit diagram of the motor driving apparatus in accordance with the embodiment of the present disclosure. Duplicated description of components common to FIG. 2 and FIGS. 3A and 3B will be omitted.

Referring to FIG. 3A, the motor driving apparatus 200 may include, for example, a battery 215, a dc-link capacitor C connected to the battery 215, a dc-link voltage detector B, an inverter 310, a dc-link resistor element Rdc disposed between the dc-link capacitor C and the inverter 310, a signal generator 320 and/or a controller 260.

For example, the dc-link capacitor C may store the DC power supplied from the battery 215. Although the drawing illustrates one element as the dc-link capacitor C, the present disclosure is not limited thereto. That is, a plurality of elements may be provided, so that it is possible to ensure element stability.

For example, the inverter 310 may be connected to dc-links that are both ends of a dc-link capacitor C, convert DC power into AC power, and output the converted AC power to the motor 230.

For example, the inverter 310 may include a plurality of switching elements (e.g., switching elements Sa, S'a, Sb, S'b, Sc, and S'c in FIG. 3B), and convert smooth DC power Vdc into three-phase AC power of a predetermined frequency by the on/off operation of the switching element, thus outputting the power to the motor 230.

For example, the inverter 310 may include upper-arm switching elements (e.g., upper-arm switching elements Sa, Sb, and Sc in FIG. 3B) and lower-arm switching elements (e.g., lower-arm switching elements S'a, S'b, and S'c in FIG. 3B). The upper-arm switching elements and the lower-arm switching elements may be connected, respectively, in series, and each of the upper-arm switching elements and each of the lower-arm switching elements may make one pair. A total of three pairs of upper and lower arm switching elements (e.g., three pairs of upper and lower arm switching elements Sa&S'a, Sb&S'b, and Sc&S'c in FIG. 3B) may be connected in parallel. A diode may be connected to each of the switching elements in anti-parallel connection.

For example, the switching elements of the inverter 310 may perform the on/off operation, on the basis of the switching signal Sic that is output from the controller 260.

For example, a dc-link voltage detector B may detect dc-link voltage Vdc to which DC power is supplied. To this end, the dc-link voltage detector B may include a resistor element, an amplifier, etc. For example, the detected dc-link voltage Vdc may be input to the controller 260, as a pulse type of discrete signal.

For example, the signal generator 320 may be connected to both ends of the dc-link resistor element Rdc that is disposed between the dc-link capacitor C and the inverter 310.

For example, the signal generator 320 may generate a plurality of signals Sc, Sp, and Sov on the basis of the current flowing through the dc-link resistor element Rdc, and transmit a plurality of generated signals Sc, Sp, and Sov to the controller 260.

Referring to FIG. 3B, the signal generator 320 may include, for example, a signal amplification part 330 connected to the dc-link resistor element Rdc and/or first and second filter parts 341 and 342 connected to an output terminal of the signal amplification part 330.

For example, the signal amplification part 330 may amplify and output voltages on both ends of the dc-link resistor element Rdc. To this end, the signal amplification part 330 may, for example, include at least one amplifier. For example, the signal amplification part 330 may include at least one operational amplifier op-amp.

For example, the first and second filter parts 341 and 342 may remove noise included in the output of the signal amplification part 330 and then output the first signal Sc and the second signal Sp, respectively.

For example, each of the first and second filter parts 341 and 342 may be an RC filter including a resistor element and a capacitor element. Meanwhile, the first and second filter parts 341 and 342 may further include a component that may filter the output of the signal amplification part 330, without being limited to the above-described configuration.

For example, each of the first and second filter parts 341 and 342 may be a low pass filter (LPF) that passes a low frequency portion of the output of the signal amplification part 330.

For example, bandwidths of the first and second filter parts 341 and 342 may be different from each other according to a circuit element provided therein. For example, the bandwidth of the first filter part 341 may be wider than the bandwidth of the second filter part 342.

For example, the signal generator 320 may further include a third filter part 343 connected to the dc-link resistor element Rdc.

For example, the third filter part 343 may be an RC filter including a resistor element and a capacitor element.

The internal circuit diagram of the signal generator 320 in accordance with various embodiments of the present disclosure will be described with reference to FIGS. 4A and 4B.

Figure 4A:
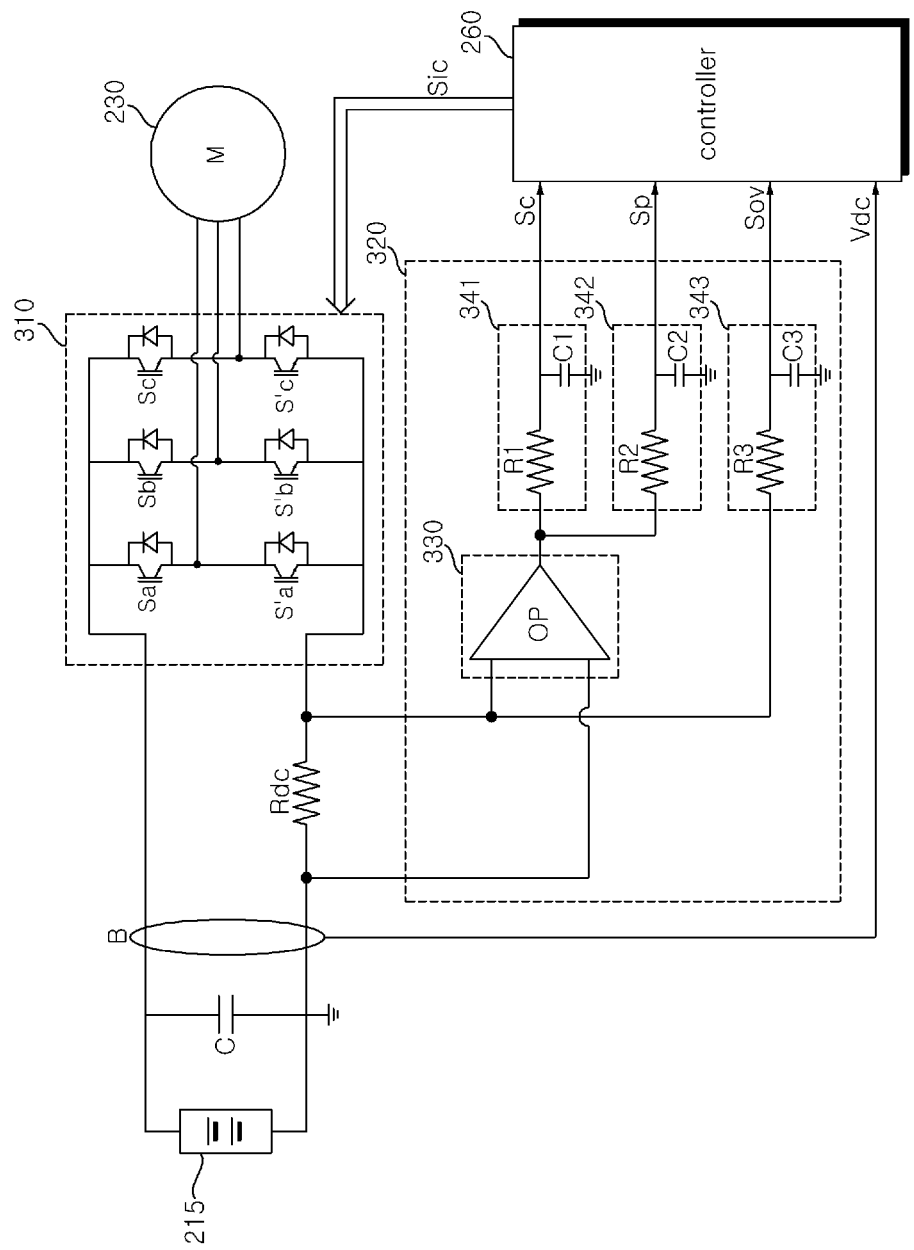
FIGS. 4A and 4B are an example of an internal circuit diagram of a signal generator provided in the motor driving apparatus in accordance with the embodiment of the present disclosure.
Figure 4B:
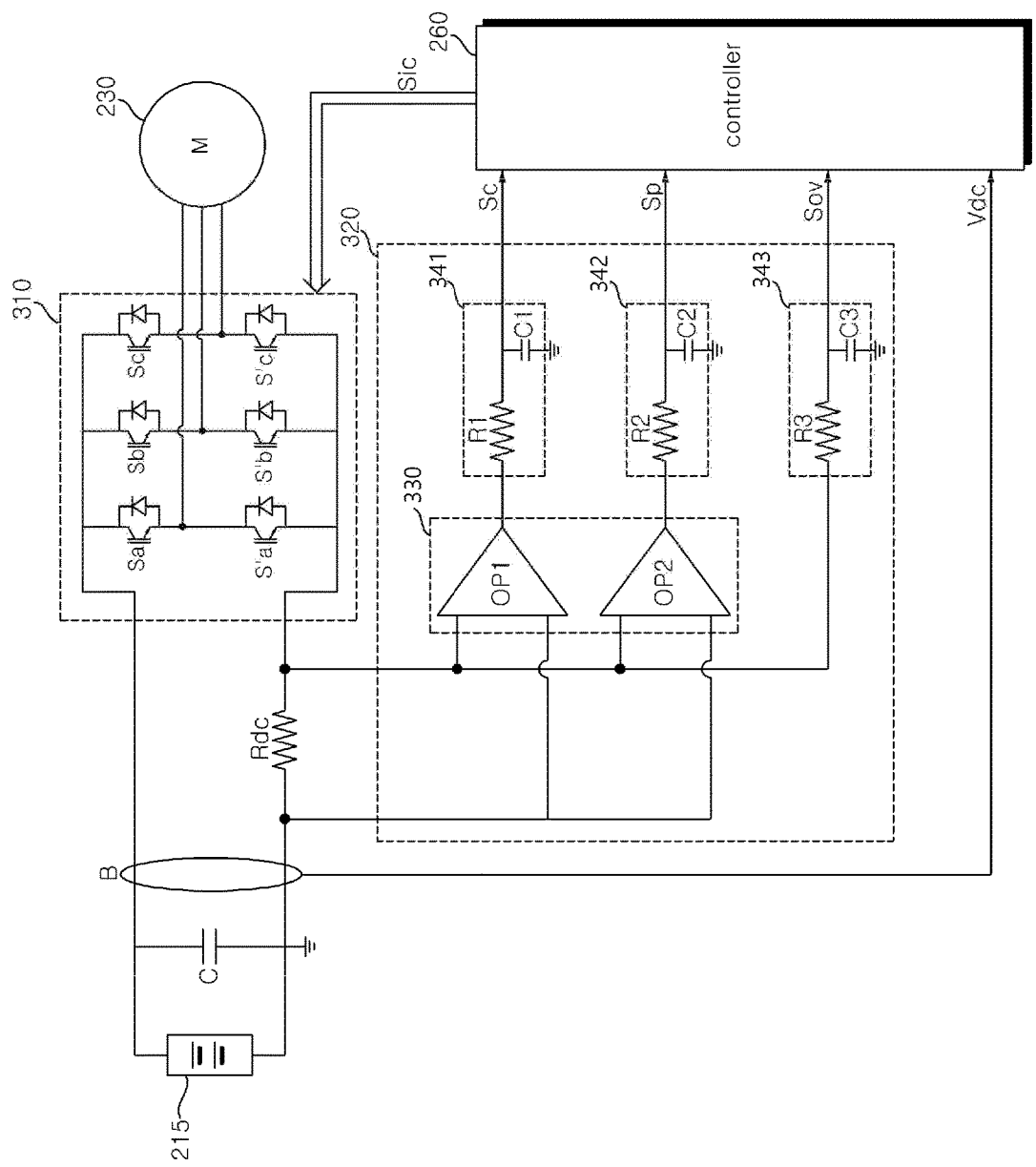

FIGS. 4A and 4B are an example of the internal circuit diagram of the signal generator provided in the motor driving apparatus in accordance with the embodiment of the present disclosure.

Referring to FIG. 4A, for example, the signal amplification part 330 may be provided with one amplifier OP that amplifies and outputs voltage on both ends of the dc-link resistor element Rdc.

For example, the first filter part 341 may include a first resistor element R1 connected between an output terminal of the amplifier OP and the controller 260, and a first capacitor C1 connected between a node to which the first resistor element R1 and the controller 260 are connected and a ground terminal.

For example, the second filter part 342 may include a second resistor element R2 connected between an output terminal of the amplifier OP and the controller 260, and a second capacitor C2 connected between a node to which the second resistor element R2 and the controller 260 are connected and the ground terminal.

Meanwhile, for example, the third filter part 343 may include a third resistor element R3 disposed between a node to which the dc-link resistor element Rdc and the inverter 310 are connected and the controller 260, and a third capacitor C3 connected between a node to which the third resistor element and the controller 260 are connected and the ground terminal.

Meanwhile, the third filter part 343 may, for example, include an over-current detection amplifier (not shown) that amplifies voltage on both ends of the dc-link resistor element Rdc. Here, the gain of the over-current detection amplifier provided in the third filter part 343 may be different from the gain of the amplifier OP provided in the signal amplification part 330, for example.

Meanwhile, the output of the over-current detection amplifier may be output, as a third signal Sov, to the controller 260.

Referring to FIG. 4B, the signal amplification part 330 may, for example, include a plurality of amplifiers OP1 and OP2 that amplify and output voltage on both ends of the dc-link resistor element Rdc. Here, the gains of the plurality of amplifiers OP1 and OP2 may be equal to or different from each other, for example.

For example, the first filter part 341 may include a first resistor element R1 connected between the output terminal of the first amplifier OP1 and the controller 260, and a first capacitor C1 connected between a node to which the first resistor element R1 and the controller 260 are connected and the ground terminal.

For example, the second filter part 342 may include a second resistor element R2 connected between the output terminal of the second amplifier OP2 and the controller 260, and a second capacitor C2 connected between a node to which the second resistor element R2 and the controller 260 are connected and the ground terminal.

For example, the controller 260 may output a switching signal Sic that controls the operation of the plurality of switching elements Sa, S'a, Sb, S'b, Sc, and S'c provided in the inverter 310.

For example, the controller 260 may generate and output the switching signal Sic, on the basis of the plurality of signals Sc, Sp, and Sov output from the signal generator 320 and/or the dc-link voltage Vdc.

For example, the controller 260 may control the operation of the inverter 310 to change the frequency of AC power flowing through the motor 230. For example, the controller 260 may control the operation of the plurality of switching elements Sa, S'a, Sb, S'b, Sc, and S'c provided in the inverter 310, thus changing the frequency of AC power flowing through the motor 230.

For example, the controller 260 may control the operation of the inverter 310 to change the rotation speed of the motor 230. For example, the controller 260 may control the operation of the inverter 310 to change the frequency of the AC power flowing through the motor 230, thus changing the rotation speed of the motor 230.

For example, the controller 260 may calculate a three-phase current flowing through the motor 230. For example, the controller 260 may calculate the three-phase current flowing through the motor 230, on the basis of the current flowing through the inverter 310 to the dc-link resistor element Rdc.

For example, the signal generator 320 may generate and output the plurality of signals Sc, Sp, and Sov on the basis of the current flowing through the dc-link resistor element Rdc, and the controller 260 may calculate the three-phase current flowing through the motor 230 on the basis of at least one of the signals Sc, Sp, and Sov.

For example, the controller 260 may calculate the three-phase current flowing through the motor 230, on the basis of the first signal Sc output through the first filter part 341 having a wide bandwidth, among the first and second filter parts 341 and 342. That is, since it is necessary to precisely calculate the three-phase current flowing through the motor 230, for example, the controller 260 may calculate the three-phase current flowing through the motor 230, on the basis of the first signal Sc output through the first filter part 341 having the wide bandwidth, among the first and second filter parts 341 and 342.

The operation of calculating the three-phase current flowing through the motor 230 will be described with reference to FIGS. 5, 6A, and 6B.

Figure 5:
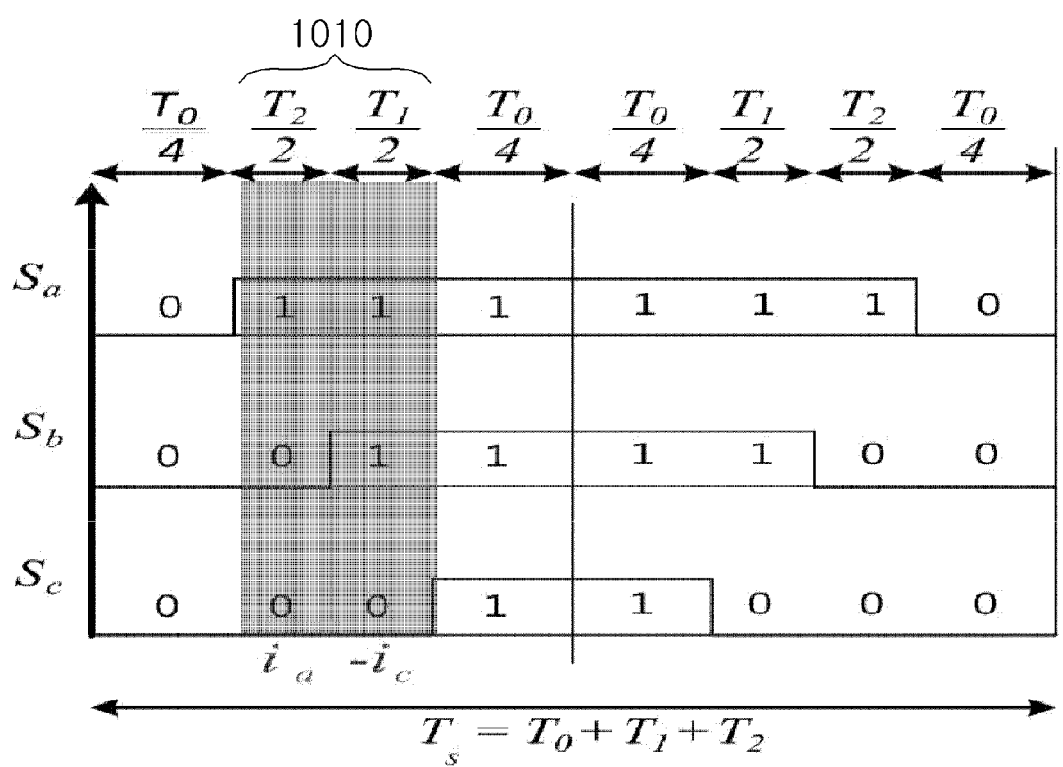
FIGS. 5, 6A and 6B are diagrams illustrating the operation of the motor driving apparatus of FIGS. 3A to 4B.
Figure 6A:
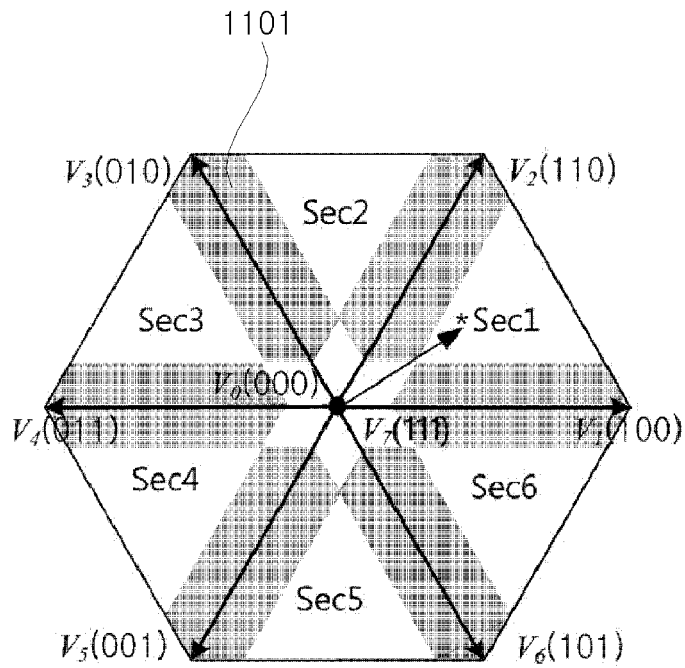
Figure 6B:
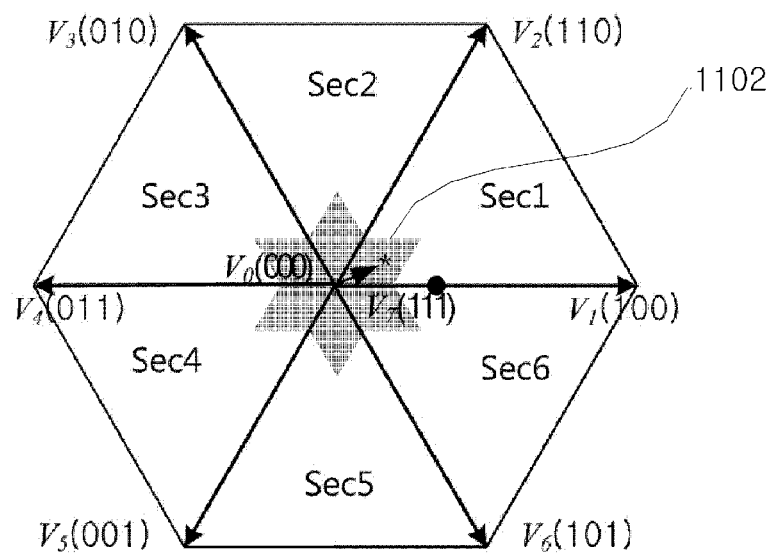

FIGS. 5, 6A and 6B are diagrams illustrating the operation of the motor driving apparatus of FIGS. 3A to 4B.

First, FIG. 5 is a diagram illustrating the switching of each switching element provided in the inverter 310 in response to an effective vector.

One-shunt method detects a phase current flowing through the motor 230 on the basis of the current flowing through the dc-link resistor element Rdc, when the effective vector is applied, in a control period Ts for one space vector PWM (SVPWM), analog to digital (A/D) converts the detected phase current, and determines a current sector and the effective vector in a gate signal generator (not shown) in the controller 260, thus reconstructing or estimating the phase current.

Here, since the vector is applied within one period Ts, phase currents of two phases may be reconstructed or estimated, and a current of the remaining one phase may be obtained in view of the fact that the sum of currents of three phases is zero.

Meanwhile, when the phase current is sequentially detected using one dc-link resistor element (e.g., dc-link resistor element Rdc in FIGS. 3A-B and 4A-B), a minimum time for the phase current is required. In the case where the switching element is switched in the inverter (e.g., inverter 310 in FIG. FIGS. 3A-B and 4A-B) within a minimum time, it may be impossible to detect the phase current using one dc-link resistor element. Such a case within the minimum time may be referred to as a dead time Tdead.

In the case where the switching element in the inverter is switched, a problem is caused by a settling time Tsettling due to a ringing phenomenon during switching, a dead time Tdead of the inverter, and an A/D conversion time TA/D. Thus, in order to detect a normal current, sampling should be performed after the above time elapsed.

As a result, a minimum effective vector application time Tmin for detecting the current flowing through the dc-link resistor element may be calculated as in the following Equation 1.

$$T_{min} = T_{dead} + T_{settling} + T_{A/D} \qquad \text{[Equation 1]}$$

That is, the minimum voltage vector application time Tmin may correspond to the sum of the settling time Tsettling due to the ringing phenomenon when the switching element in the inverter is switched, the dead time Tdead of the inverter, and the A/D conversion time TA/D during the sampling.

Meanwhile, a case where the effective vector is applied for a time shorter than the minimum effective vector application time will be described with reference to FIGS. 6A and 6B.

FIGS. 6A and 6B are diagrams illustrating the case where the effective vector is applied for a time shorter than the minimum effective vector application time.

FIG. 6A illustrates the case where the application time of one effective vector within one switching period is shorter than the minimum effective vector application time Tmin, in the space vector PWM (SVPWM) hexagon.

Referring to FIG. 6A, in areas Sec1 to Sec6 around vectors V1 to V6, an area 1101 where it is impossible to detect the current through the dc-link resistor element may be generated. This area will be referred to as a non-measurable area or a dead band.

FIG. 6B illustrates the case where the application time of two effective vectors within one switching period is shorter than the minimum effective vector application time Tmin, in the space vector PWM (SVPWM) hexagon.

Referring to FIG. 6B, in an area around a zero vector, an area 1102 where it is impossible to detect the current through the dc-link resistor element is generated.

Meanwhile, unless the current is detected in the area where it is impossible to detect the current, the motor is not controlled precisely.

Meanwhile, in order to prevent the area where it is impossible to detect the current from being generated, the technique of changing a symmetrical switching timing into an asymmetrical timing or shifting a turn-on timing of the switching element may be used, but a detailed description thereof will be omitted herein.

Turning back to FIGS. 3A to 4B, the controller 260 may calculate the rotation speed of the motor 230. For example, the controller 260 may calculate the rotation speed of the motor 230, on the basis of the three-phase current flowing through the motor 230.

For example, the controller 260 may convert current into the two-phase current iα and iβ of a stationary coordinate system using the three-phase current flowing through the motor 230, and convert the two-phase current iα and iβ of the stationary coordinate system into the two-phase current id and iq of a rotating coordinate system.

For example, the controller 260 may calculate the position $\hat{\theta}_r$ and rotation speed $\hat{\omega}_r$ of the rotor, on the basis of the two-phase current iα and iβ of the stationary coordinate system, which is axis-converted in an axis conversion part.

For example, the controller 260 may determine whether it is necessary to change the output power of the inverter 310, on the basis of the current flowing through the dc-link resistor element Rdc.

For example, the controller 260 may calculate the intensity of the current flowing through the dc-link resistor element Rdc, on the basis of the second signal Sp output through the second filter part 342 having a narrow bandwidth, among the first and second filter parts 341 and 342, and determine whether it is necessary to change the output power of the inverter 310.

That is, instead of precisely calculating the three-phase current flowing through the motor 230, the controller 260 may, for example, calculate the intensity of the current flowing through the dc-link resistor element Rdc, on the basis of the second signal Sp output through the second filter part 342 having the narrow bandwidth, among the first and second filter parts 341 and 342, thus more rapidly calculating only the intensity of the current flowing through the dc-link resistor element Rdc.

In this regard, a target for determining whether it is necessary to change the output power of the inverter 310 may, for example, vary depending on the operation mode of the motor driving apparatus.

For example, when the intensity of the current flowing through the dc-link resistor element Rdc is less than a first target and is equal to or more than a second target, on the basis of the second signal Sp, the controller 260 may control the operation of the inverter 310 to maintain the output power of the inverter 310.

For example, when the intensity of the current flowing through the dc-link resistor element Rdc is less than the second target and is equal to or more than a third target, on the basis of the second signal Sp, the controller 260 may control the operation of the inverter 310 to increase the output power of the inverter 310.

For example, when the intensity of the current flowing through the dc-link resistor element Rdc is less than the third target, on the basis of the second signal Sp, the controller 260 may control the operation of the inverter 310 to stop the operation of the motor 230.

Meanwhile, for example, when the intensity of the current flowing through the dc-link resistor element Rdc is equal to or more than the first target, on the basis of the second signal Sp, the controller 260 may control the operation of the inverter 310 to reduce the output power of the inverter 310.

Meanwhile, the controller 260 may, for example, determine whether it is necessary to change the output power of the inverter 310, on the basis of the rotation speed of the motor 230.

For example, when the rotation speed of the motor 230 is less than a first target speed, the controller 260 may control the operation of the inverter 310 to reduce the output power of the inverter 310.

For example, when the rotation speed of the motor 230 is equal to or more than the first target speed and less than a second target speed, the controller 260 may control the operation of the inverter 310 to maintain the output power of the inverter 310.

For example, when the rotation speed of the motor 230 is equal to or more than the second target speed and less than a third target speed, the controller 260 may control the operation of the inverter 310 to increase the output power of the inverter 310.

For example, when the rotation speed of the motor 230 is equal to or more than the third target speed, the controller 260 may control the operation of the inverter 310 to stop the operation of the motor 230.

For example, the controller 260 may compare the intensity of the current flowing through the dc-link resistor element Rdc with a determination target for the operation mode of the motor driving apparatus 200, thus determining whether it is necessary to change the output power of the inverter 310. Subsequently, on the basis of the rotation speed of the motor 230, the controller may further determine whether it is necessary to change the output power of the inverter 310.

For example, the controller 260 may control the operation of the inverter 310 to change the output power of the inverter 310. For example, the controller 260 may change the intensity of the output current flowing through the motor 230, by controlling the operation of the plurality of switching elements Sa, S'a, Sb, S'b, Sc, and S'c provided in the inverter 310, thus changing the output power of the inverter 310.

In the case of the cleaner 100*a* that is an example of the home appliance, when a distance between an inlet port of the nozzle part 71 through which air is sucked and an object (e.g. floor) is within a predetermined target, the flow volume of air flowing through the path P may be within a predetermined target range, and a load acting on the motor 230 may also satisfy a predetermined target.

Here, since the intensity of the current flowing through the motor 230 is likewise within a predetermined range, the motor driving apparatus 200 may maintain the output power of the inverter 310.

Meanwhile, if the flow volume of the air flowing through the path P decreases, for example, if at least a portion of the inlet port of the nozzle part 71 through which the air is sucked is blocked by foreign matter, the load acting on the motor 230 is reduced, and the rotation speed of the motor 230 is increased due to a reduction in load acting on the motor 230. Meanwhile, if the load acting on the motor 230 is reduced, the intensity of the current flowing through the motor 230 is reduced.

Here, the motor driving apparatus 200 may determine whether it is necessary to change the output power of the inverter 310, on the basis of the intensity of the current flowing through the dc-link resistor element Rdc, and control the inverter 310 depending on the intensity of the current flowing through the dc-link resistor element Rdc.

For example, when the inlet port of the nozzle part 71 is at least partially blocked, so that the intensity of the current flowing through the dc-link resistor element Rdc is less than a second target and equal to or more than a third target, the motor driving apparatus 200 may increase the output power of the inverter 310, thus eliminating factors that interfere with the flow of the air.

For example, when the inlet port of the nozzle part 71 is completely blocked, so that the intensity of the current flowing through the dc-link resistor element Rdc is less than the third target, the motor driving apparatus 200 may control the operation of the inverter 310 to stop the operation of the motor 230.

Meanwhile, when the flow volume of the air flowing through the path P of the cleaner 100*a* increases, for example, when the nozzle part 71 is spaced apart from the ground by a predetermined distance, so that there is no factor interfering with the suction of the air through the nozzle part 71, the load acting on the motor 230 is increased. Due to the increase in load acting on the motor 230, the rotation speed of the motor 230 is reduced, and the intensity of the current flowing through the motor 230 is increased.

For example, when the intensity of the current flowing through the dc-link resistor element Rdc is equal to or more than a first target, the motor driving apparatus 200 may control to reduce the output power of the inverter 310.

Figure 7:
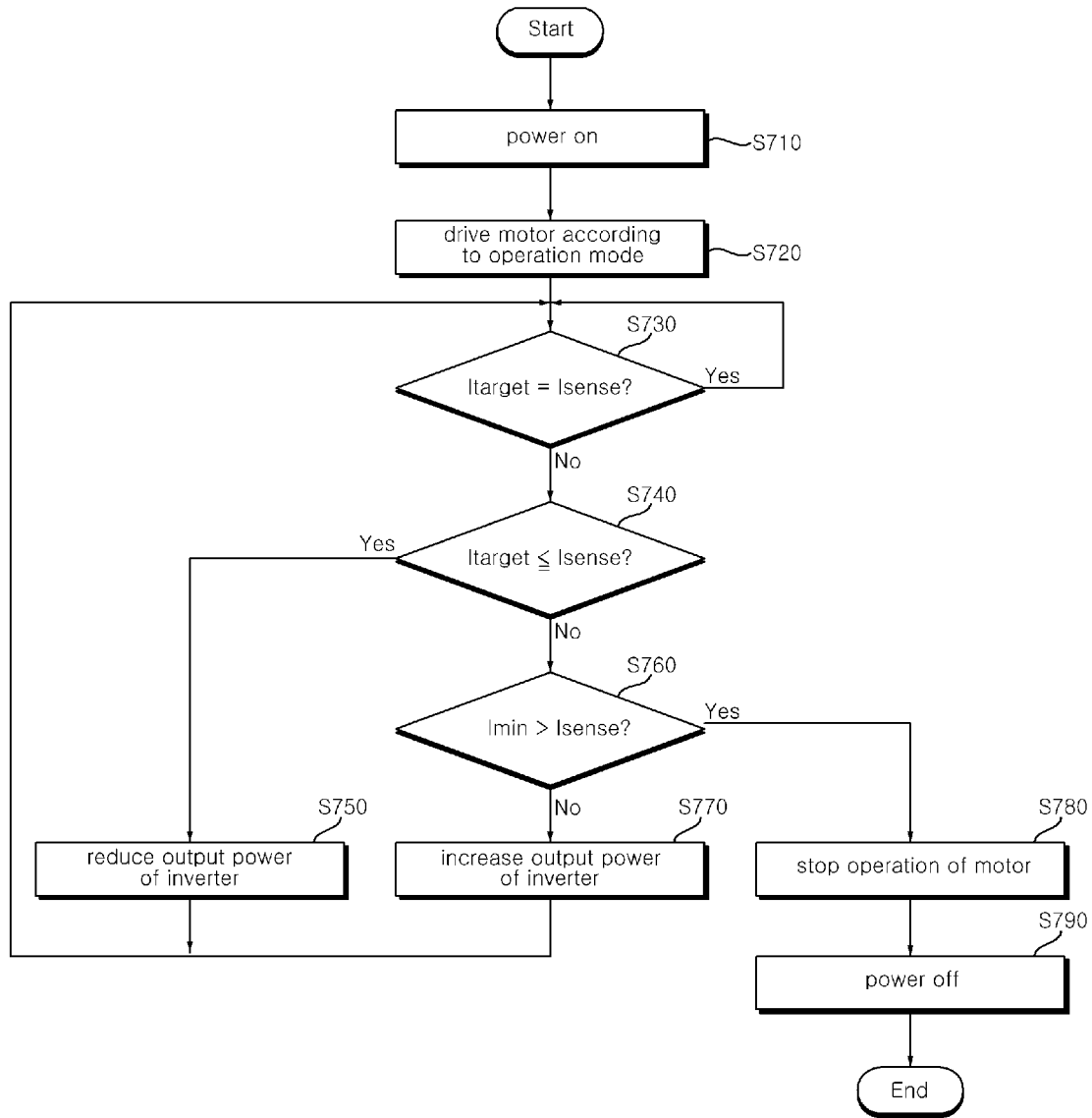
FIG. 7 is a flowchart illustrating an operation method of a motor driving apparatus in accordance with an embodiment of the present disclosure.

FIG. 7 is a flowchart illustrating an operation method of a motor driving apparatus in accordance with an embodiment of the present disclosure.

Referring to FIG. 7, the motor driving apparatus 200 may turn on the power of the home appliance in operation S710.

For example, when a power key for turning on/off the power of the input part 240 is turned on, the power of the home appliance may be turned on, and the motor driving apparatus 200 may be supplied with power through the power supply part 210.

The motor driving apparatus 200 may drive the motor 230 according to the operation mode, in operation S720.

For example, when the operation mode of the motor driving apparatus 200 is set to the first mode through an operation key for setting the operation mode of the motor driving apparatus 200, the motor driving apparatus 200 may control the inverter 310 to drive the motor 230 according to a rotation speed that is preset to correspond to the first mode.

The motor driving apparatus 200 may check whether the intensity of the current flowing through the dc-link resistor element Rdc satisfies a predetermined target Itarget, in operation S730.

For example, the motor driving apparatus 200 may check whether the intensity Isense of the current flowing through the dc-link resistor element Rdc is less than a first target and is equal to or more than a second target.

When the intensity Isense of the current flowing through the dc-link resistor element Rdc satisfies a predetermined target Itarget, the motor driving apparatus 200 may control the operation of the inverter 310 to maintain the output power of the inverter 310.

Meanwhile, the motor driving apparatus 200 may check whether the intensity Isense of the current flowing through the dc-link resistor element Rdc is equal to or more than the predetermined target Itarget, in operation S740.

For example, the motor driving apparatus 200 may check whether the intensity Isense of the current flowing through the dc-link resistor element Rdc is equal to or more than the first target.

When the intensity Isense of the current flowing through the dc-link resistor element Rdc is equal to or more than the predetermined target Itarget, the motor driving apparatus 200 may reduce the output power of the inverter 310, in operation S750.

For example, when the intensity Isense of the current flowing through the dc-link resistor element Rdc is equal to or more than the first target, the motor driving apparatus 200 may control the operation of the inverter 310 to reduce the intensity of output current flowing through the motor 230, thus reducing the output power of the inverter 310.

Meanwhile, when the intensity Isense of the current flowing through the dc-link resistor element Rdc is less than the predetermined target Itarget, the motor driving apparatus 200 may check whether the intensity Isense of the current flowing through the dc-link resistor element Rdc is less than a minimum target Imin, in operation S760.

For example, when the intensity Isense of the current flowing through the dc-link resistor element Rdc is less than a second target, the motor driving apparatus 200 may check whether the intensity Isense of the current flowing through the dc-link resistor element Rdc is less than a third target.

When the intensity Isense of the current flowing through the dc-link resistor element Rdc is equal to or more than the minimum target Imin, the motor driving apparatus 200 may increase the output power of the inverter 310, in operation S770.

For example, when the intensity Isense of the current flowing through the dc-link resistor element Rdc is less than the second target and is equal to or more than the third target, the motor driving apparatus 200 may control the operation of the inverter 310 to increase the intensity of output current flowing through the motor 230, thus increasing the output power of the inverter 310.

Meanwhile, when the intensity Isense of the current flowing through the dc-link resistor element Rdc is less than the minimum target Imin, the motor driving apparatus 200 may stop the operation of the motor 230, in operation S780.

For example, when the intensity Isense of the current flowing through the dc-link resistor element Rdc is less than the third target, the motor driving apparatus 200 may control the operation of the inverter 310 to stop the operation of the motor 230.

When the operation of the motor 230 is stopped, the motor driving apparatus 200 may turn off the power of the home appliance, in operation S790.

Meanwhile, for example, when the operation of the motor 230 is stopped, the motor driving apparatus 200 may display a message related to the occurrence of an error and output a warning sound for the error occurrence, through the output part 250.

As such, since the operation of the motor 230 is controlled by calculating the phase current flowing through the motor 230, the rotation speed of the motor 230, etc. using one dc-link resistor element Rdc, various embodiments of the present disclosure are advantageous in that a manufacturing cost and a volume are reduced in comparison with a general sensor type motor driving apparatus or a sensorless type motor driving apparatus having a plurality of resistor elements.

Furthermore, according to various embodiments of the present disclosure, since the controller 260 separately receives the first signal Sc for detecting the phase current flowing through the motor 230, and the second signal Sp for determining whether it is necessary to change the output power of the inverter 310, it is possible to more rapidly and efficiently control the operation of the motor 230, in comparison with the case of both detecting the phase current and determining whether it is necessary to change the output power of the inverter on the basis of one signal.

Furthermore, according to various embodiments of the present disclosure, since the operation of extracting the first signal Sc for detecting the phase current flowing through the motor 230 and the second signal Sp for determining whether it is necessary to change the output power of the inverter 310 from one signal generated on the basis of voltage on both ends of the dc-link resistor element Rdc may be omitted, the calculation amount of the controller 260 for controlling the operation of the motor 230 may be reduced.

Furthermore, according to various embodiments of the present disclosure, since the first signal Sc for detecting the phase current flowing through the motor 230 and the second signal Sp for determining whether it is necessary to change the output power of the inverter 310 are separately output through the plurality of RC filters 341 and 342 having different bandwidths, the controller 260 may more precisely receive signals required for controlling the operation of the motor 230.

Since the accompanying drawings are merely for easily understanding embodiments disclosed herein, it should be understood that the technical spirit disclosed herein is not limited by the accompanying drawings, and all changes, equivalents or substitutions are included in the spirit and technical scope of the present disclosure.

Likewise, although operations are shown in a specific order in the drawings, it should not be understood that the operations are performed in the specific order shown in the drawings or in a sequential order so as to obtain desirable results, or all operations shown in the drawings are performed. In certain cases, multitasking and parallel processing may be advantageous.

Although the present disclosure has been described with reference to specific embodiments shown in the drawings, it is apparent to those skilled in the art that the present description is not limited to those exemplary embodiments and is embodied in many forms without departing from the scope of the present disclosure, which is described in the following claims. These modifications should not be individually understood from the technical spirit or scope of the present disclosure.

According to various embodiments of the present disclosure, since a controller separately receives a first signal for detecting a phase current flowing through a motor and a second signal for determining whether it is necessary to change the output power of an inverter, in a motor control process, it is possible to more rapidly and efficiently control the motor, as compared with the case of both detecting the phase current and determining whether it is necessary to change the output power of the inverter on the basis of one signal.

Furthermore, according to various embodiments of the present disclosure, the operation of extracting a first signal portion for detecting a phase current flowing through a motor and a second signal portion for determining whether it is necessary to change output power of an inverter, from one signal generated on the basis of voltages on both ends of a dc-link resistor element, can be omitted, thus reducing the calculation amount of a controller for controlling the motor.

In addition, according to various embodiments of the present disclosure, a plurality of RC filters having different bandwidths is provided, so that a controller can more precisely receive a plurality of signals required for controlling a motor, and can reduce a calculation amount required for processing a signal.

Furthermore, according to various embodiments of the present disclosure, since the operation of an inverter and a motor is controlled on the basis of voltages on both ends of a dc-link resistor element, it is possible to increase price competitiveness as compared with the sensor type motor driving apparatus or the sensorless type motor driving apparatus having a plurality of resistor elements.

What is claimed is:

1. A motor driving apparatus for a home appliance, comprising:
   a power supply part configured to supply DC power;
   a DC-Link capacitor connected to the power supply part;
   an inverter connected to the DC-Link capacitor and comprising a plurality of switching elements, the inverter being configured to convert, by operating the plurality of switching elements, the DC power into AC power and output the converted AC power to a motor;
   a DC-Link resistor element disposed between the DC-Link capacitor and the inverter;
   a signal generator connected to the DC-Link resistor element and configured to generate and output a plurality of signals based on an output current flowing through the DC-Link resistor element; and
   a controller configured to control the inverter based on the plurality of signals received from the signal generator,
   wherein the signal generator comprises:
      a first filter that is configured to reduce noise included in voltage on both ends of the DC-Link resistor element and that has a first bandwidth, and
      a second filter that is configured to reduce noise included in the voltage and that has a second bandwidth narrower than the first bandwidth, and
   wherein the controller is configured to:
      calculate a phase current flowing through the motor based on a first signal output from the first filter, and
      calculate an intensity of the output current based on a second signal output from the second filter.

2. The motor driving apparatus of claim 1, wherein the controller is configured to:
   adjust output power of the inverter based on at least one of the calculated intensity of the output current or the calculated phase current.

3. The motor driving apparatus of claim 2, wherein the motor is a three-phase motor, and
   wherein the controller is configured to:
      calculate a three-phase current flowing through the motor based on the first signal, and
      calculate a rotation speed of the motor based on the calculated three-phase current.

4. The motor driving apparatus of claim 3, wherein the signal generator comprises:
   a signal amplification part configured to amplify and output the voltage on both ends of the DC-Link resistor element;
   a first filter configured to eliminate noise included in output of the signal amplification part, and output the first signal; and
   a second filter configured to reduce noise included in the output of the signal amplification part and output the second signal.

5. The motor driving apparatus of claim 4, wherein the signal amplification part comprises an amplifier configured to amplify and output voltage on both ends of the DC-Link resistor element,
   wherein the first filter comprises:
      a first resistor element connected between an output terminal of the amplifier and the controller; and
      a first capacitor element connected between a ground terminal and a first node, the first node connecting the first resistor element and the controller, and
   wherein the second filter comprises:
      a second resistor element connected between the output terminal of the amplifier and the controller; and
      a second capacitor element connected between the ground terminal and a second node, the second node connecting the second resistor element and the controller.

6. The motor driving apparatus of claim 5, wherein the controller is configured to control the inverter to reduce the output power of the inverter based on the calculated intensity of the output current being equal to or higher than a first target.

7. The motor driving apparatus of claim 6, wherein the controller is configured to control the inverter to maintain the output power of the inverter based on the calculated intensity of the output current being lower than the first target and being equal to or more than a second target.

8. The motor driving apparatus of claim 7, wherein the controller is configured to control the inverter to increase the output power of the inverter based on the calculated intensity of the output current being lower than the second target and being equal to or higher than a third target.

9. The motor driving apparatus of claim 8, wherein the controller is configured to control the inverter to stop an operation of the motor based on the calculated intensity of the output current being lower than the third target.

10. The motor driving apparatus of claim 9, further comprising:
an output part configured to output a message,
wherein the controller is configured to output an error message related to the stopped operation of the motor through the output part based on the operation of the motor being stopped.

11. The motor driving apparatus of claim 10, wherein the controller is configured to determine whether an overcurrent is conducted to the inverter based on a third signal received from the signal generator.

12. The motor driving apparatus of claim 4, wherein the signal amplification part comprises a plurality of amplifiers configured to amplify and output voltage on both ends of the DC-Link resistor element,
wherein the first filter comprises:
a first resistor element connected between an output terminal of a first amplifier of the plurality of amplifiers and the controller; and
a first capacitor element connected between a ground terminal and a first node, the first node connecting the first resistor element and the controller, and
wherein the second filter comprises:
a second resistor element connected between an output terminal of a second amplifier of the plurality of amplifiers and the controller; and
a second capacitor element connected between the ground terminal and a second node, the second node connecting the second resistor element and the controller.

13. The motor driving apparatus of claim 12, wherein the controller is configured to control the inverter to reduce the output power of the inverter based on the calculated intensity of the output current being equal to or higher than a first target.

14. The motor driving apparatus of claim 13, wherein the controller is configured to control the inverter to maintain the output power of the inverter based on the calculated intensity of the output current being lower than the first target and being equal to or higher than a second target.

15. The motor driving apparatus of claim 14, wherein the controller is configured to control the inverter to increase the output power of the inverter based on the calculated intensity of the output current being lower than the second target and being equal to or higher than a third target.

16. The motor driving apparatus of claim 15, wherein the controller is configured to control the inverter to stop an operation of the motor based on the calculated intensity of the output current being lower than the third target.

17. The motor driving apparatus of claim 16, further comprising:
an output part configured to output a message,
wherein the controller is configured to output an error message related to the stopped operation of the motor through the output part based on the operation of the motor being stopped.

18. The motor driving apparatus of claim 15, wherein the signal generator further comprises a third filter comprising:
a third resistor element connected between the controller and a third node, the third node connecting the DC-Link resistor element and the inverter; and
a third capacitor element connected between the ground terminal and a fourth node, the fourth node connecting the third resistor element and the controller.

19. A home appliance comprising a motor driving apparatus according to claim 1.

* * * * *